United States Patent
Hikasa et al.

(10) Patent No.: US 10,411,105 B2
(45) Date of Patent: *Sep. 10, 2019

(54) SEMICONDUCTOR DEVICE AND METHOD FOR MANUFACTURING SEMICONDUCTOR DEVICE

(71) Applicants: ROHM CO., LTD., Kyoto-shi, Kyoto (JP); LAPIS Semiconductor Co., Ltd., Yokohama-shi, Kanagawa (JP)

(72) Inventors: Akihiro Hikasa, Kyoto (JP); Kazusuke Kato, Miyazaki (JP)

(73) Assignees: ROHM CO., LTD., Kyoto (JP); LAPIS SEMICONDUCTOR CO., LTD., Kanagawa (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/019,190

(22) Filed: Jun. 26, 2018

(65) Prior Publication Data

US 2018/0315826 A1 Nov. 1, 2018

Related U.S. Application Data

(63) Continuation of application No. 15/410,304, filed on Jan. 19, 2017, now Pat. No. 10,038,071.

(30) Foreign Application Priority Data

Jan. 28, 2016 (JP) ................... 2016-014560

(51) Int. Cl.
*H01L 33/00* (2010.01)
*H01L 29/45* (2006.01)
(Continued)

(52) U.S. Cl.
CPC ........ *H01L 29/45* (2013.01); *H01L 21/02244* (2013.01); *H01L 21/0485* (2013.01);
(Continued)

(58) Field of Classification Search
CPC ........... H01L 21/02244; H01L 21/0485; H01L 21/32051; H01L 21/32134; H01L 29/16; H01L 29/45
(Continued)

(56) References Cited

U.S. PATENT DOCUMENTS 5,243,204 A 9/1993 Suzuki et al.
8,008,680 B2 8/2011 Yu et al.
(Continued)

FOREIGN PATENT DOCUMENTS

JP 5256357 B2 8/2013

*Primary Examiner* — Tan N Tran
(74) *Attorney, Agent, or Firm* — Hamre, Schumann, Mueller & Larson, P.C.

(57) ABSTRACT

A semiconductor device according to the present invention includes: a semiconductor layer including a first conductivity type semiconductor region and a second conductivity type semiconductor region joined to the first conductivity type semiconductor region; and a surface electrode connected to the second conductivity type region on one surface of the semiconductor layer, including a first Al-based electrode, a second Al-based electrode, an Al-based oxide film interposed between the first Al-based electrode and the second Al-based electrode, and a plated layer on the second Al-based electrode.

18 Claims, 18 Drawing Sheets

(51) Int. Cl.
*H01L 21/02* (2006.01)
*H01L 21/04* (2006.01)
*H01L 21/3205* (2006.01)
*H01L 21/3213* (2006.01)
*H01L 29/16* (2006.01)
*H01L 29/732* (2006.01)
*H01L 29/739* (2006.01)
*H01L 29/78* (2006.01)
*H01L 29/861* (2006.01)
*H01L 29/40* (2006.01)
*H01L 29/417* (2006.01)
*H01L 29/423* (2006.01)
*H01L 29/66* (2006.01)
*H01L 29/06* (2006.01)
*H01L 23/532* (2006.01)

(52) U.S. Cl.
CPC .. *H01L 21/32051* (2013.01); *H01L 21/32134* (2013.01); *H01L 23/53223* (2013.01); *H01L 29/0615* (2013.01); *H01L 29/0619* (2013.01); *H01L 29/16* (2013.01); *H01L 29/1608* (2013.01); *H01L 29/401* (2013.01); *H01L 29/404* (2013.01); *H01L 29/41708* (2013.01); *H01L 29/41725* (2013.01); *H01L 29/42304* (2013.01); *H01L 29/456* (2013.01); *H01L 29/66068* (2013.01); *H01L 29/66128* (2013.01); *H01L 29/66712* (2013.01); *H01L 29/66734* (2013.01); *H01L 29/732* (2013.01); *H01L 29/7395* (2013.01); *H01L 29/7397* (2013.01); *H01L 29/7802* (2013.01); *H01L 29/7811* (2013.01); *H01L 29/7813* (2013.01); *H01L 29/861* (2013.01); *H01L 29/8611* (2013.01); *H01L 29/0638* (2013.01)

(58) Field of Classification Search
USPC .............................................. 257/77, 98, 99
See application file for complete search history.

(56) References Cited

U.S. PATENT DOCUMENTS

| | | |
|---|---|---|
| 8,183,589 B2 | 5/2012 | Jeong |
| 9,299,881 B2 | 3/2016 | Yan et al. |
| 9,401,495 B2 | 7/2016 | Kato et al. |
| 10,038,071 B2 * | 7/2018 | Hikasa ............. H01L 21/02244 |

* cited by examiner

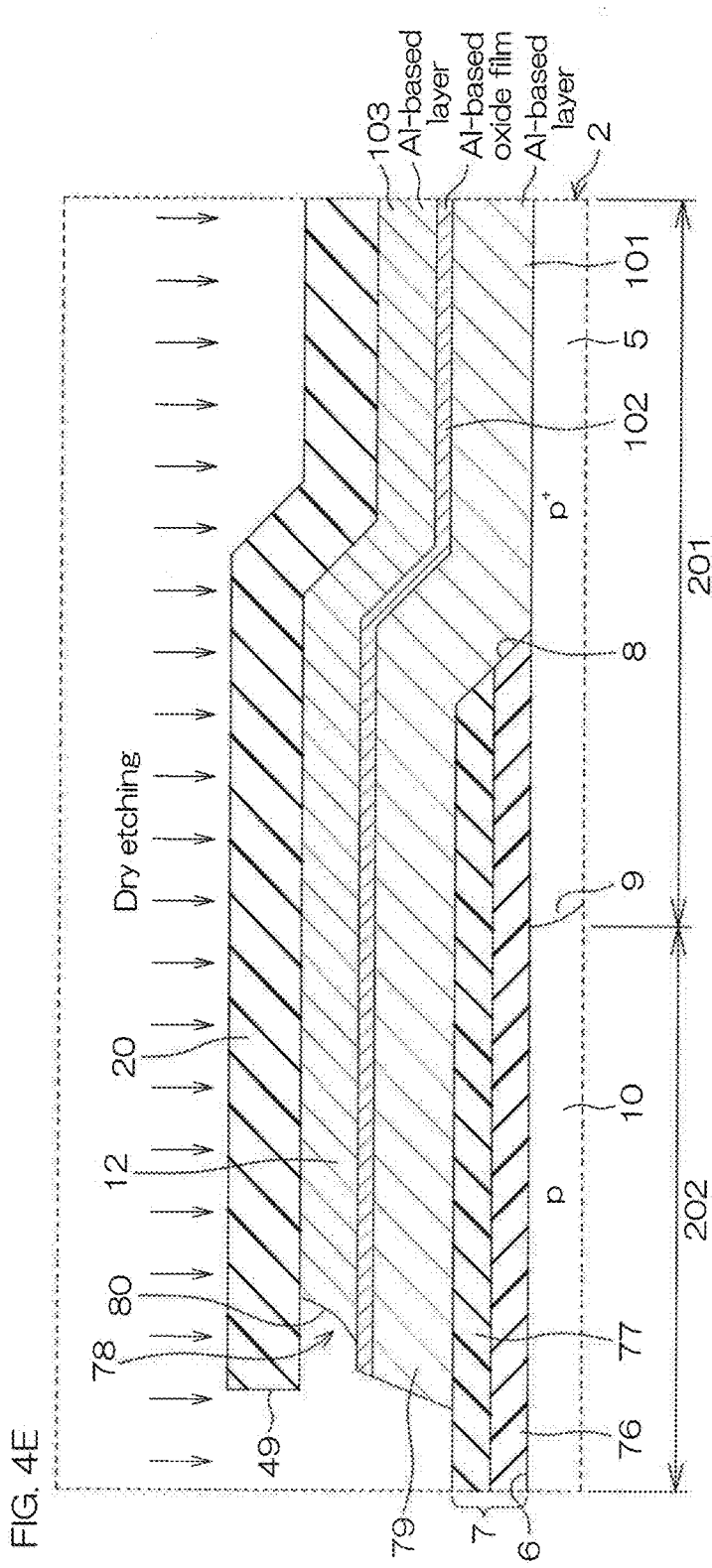

⟨Generation of hillocks⟩

⟨Generation of cavities⟩

SEMICONDUCTOR DEVICE AND METHOD FOR MANUFACTURING SEMICONDUCTOR DEVICE

CROSS-REFERENCE TO RELATED APPLICATIONS

This application corresponds to Patent Application No. 2016-14560 submitted to Japanese Patent Office on Jan. 28, 2016, and the entire contents of the application is hereby incorporated by reference.

TECHNICAL FIELD

The present invention relates to a semiconductor device including a surface electrode having a plated layer, and a method for manufacturing the semiconductor device.

BACKGROUND ART

For example, a patent literature 1 (Japanese Patent Publication 5256357) discloses a diode that includes an anode electrode, a p-layer, an n⁻ drift layer, an n-layer, a cathode layer, and a cathode electrode as an example of an element for use in a power module. In this diode, the p-layer, the n⁻ drift layer, the n-layer, and the cathode layer is made of Si having conductivity-type impurities doped therein.

SUMMARY OF THE INVENTION

As an example of the structure of a surface electrode such as an anode electrode shown in the patent literature 1, for example, a laminate structure is adopted, which is formed by electroless plating of Ni/Au and so forth on the surface of an Al-based electrode. However, when this type of laminate structure is formed in the conventional manner, an Si substrate might be eroded by an alkaline-based agent (etching solution) that is used when performing electroless plating.

Specifically, when an Al-based electrode is annealed after being formed on an Si surface, Al is subjected to plastic deformation due to the difference of a linear expansion coefficient between Al and Si and hillocks are easily generated on the Al surface. Thereafter, when the Al contracts by being cooled, cavities and spaces are likely to be formed in a grain boundary under the hillocks. Then, if the surface of the Al-based electrode is etched by the alkaline-based agent in the presence of the cavities and so forth, etching is performed while the alkaline-based agent remains in the cavities and so forth on the Si surface.

On the other hand, the Al-based electrode may be prevented from coming in contact with Si by a barrier metal provided between the Al-based electrode and the Si, however, a barrier metal such as Ti gives a high barrier against, for example, p-type Si, thereby creating a trade-off with an increase in forward voltage.

An embodiment according to the present invention provides a semiconductor device and a method for manufacturing the semiconductor device capable of suppressing the contact resistance of a surface electrode with respect to a semiconductor layer to a lower level, and preventing the semiconductor layer from being damaged by a pretreatment agent for electroless plating during the electroless plating of the plated layer for the surface electrode.

An embodiment according to the present invention provides a semiconductor device that includes a semiconductor layer having a first conductivity type semiconductor region and a second conductivity type semiconductor region joined to the first conductivity type semiconductor region, and a surface electrode connected to the second conductivity type region on one surface of the semiconductor layer, having a first Al-based electrode, a second Al-based electrode, an Al-based oxide film between the first Al-based electrode and the second Al-based electrode, and a plated layer on the second Al-based electrode.

In the semiconductor device according to an embodiment of the present invention, the second Al-based electrode may have fine irregularities in at least a boundary portion with the plated layer.

In the semiconductor device according to an embodiment of the present invention, the second Al-based electrode may be thinner than the first Al-based electrode.

In the semiconductor device according to an embodiment of the present invention, the first Al-based electrode has a thickness of 3.0 μm to 5.0 μm, and the second Al-based electrode has a thickness of 1.0 μm to 2.0 μm.

In the semiconductor device according to an embodiment of the present invention, the Al-based oxide film has a thickness of 10 Å to 40 Å.

In the semiconductor device according to an embodiment of the present invention, the plated layer has a thickness of 2.0 μm to 5.0 μm.

In the semiconductor device according to an embodiment of the present invention, the first Al-based electrode may be made of at least one material selected from a group of Al, AlSi, AlCu, and AlSiCu.

In the semiconductor device according to an embodiment of the present invention, the second Al-based electrode may be made of at least one material selected from a group of Al, AlSi, AlCu, and AlSiCu.

In the semiconductor device according to an embodiment of the present invention, the Al-based oxide film may be made of aluminum oxide.

In the semiconductor device according to an embodiment of the present invention, the plated layer may have an Ni layer on at least a portion in contact with the second Al-based electrode.

In the semiconductor device according to an embodiment of the present invention, the semiconductor layer may be made of Si or SiC.

The semiconductor device according to an embodiment of the present invention may include a pn diode.

The semiconductor device according to an embodiment of the present invention may include an IGBT.

The semiconductor device according to an embodiment of the present invention may include a MISFET.

The semiconductor device according to an embodiment of the present invention may include a bipolar transistor.

An embodiment according to the present invention provides a method for manufacturing a semiconductor device that includes a step of forming a first Al-based electrode on one surface of a semiconductor layer having a first conductivity type semiconductor region and a second conductivity type semiconductor region joined to the first conductivity type semiconductor region, so as to be connected to the second conductivity type semiconductor region, a step of forming an Al-based oxide film on the first Al-based electrode, a step of forming a second Al-based electrode on the Al-based oxide film, and a step of forming a plated layer on the second Al-based electrode by electroless plating.

In the method for manufacturing the semiconductor device according to the embodiment of the present invention, the step of forming the Al-based oxide film may include a step of oxidizing the surface of the first Al-based electrode.

In the method for manufacturing the semiconductor device according to the embodiment of the present invention, the step of oxidizing the surface of the first Al-based electrode may include a step of heat treating the first Al-based electrode in the atmosphere.

The method for manufacturing the semiconductor device according to the embodiment of the present invention may include a step of annealing the second Al-based electrode after the formation of the second Al-based electrode.

The method for manufacturing the semiconductor device according to the embodiment of the present invention may include a step of etching the surface of the second Al-based electrode using an alkaline-based agent prior to the formation of the plated layer.

Effects of Invention

According to an embodiment of the present invention, an Al-based oxide film is provided between a first Al-based electrode and a second Al-based electrode. The Al-based oxide film functions as a grain boundary separation layer that separates the grain boundary face between the first Al-based electrode and the second Al-based electrode. Thereby, even if the first Al-based electrode is subjected to plastic deformation, the second Al-based electrode does not take over the grain boundary of the first Al-based electrode, and thus hillocks can be prevented from occurring on the Al surface of the second Al-based electrode. As a result, cavities or the like, which may form flow passages for an alkaline-based agent after the temperature decreases, are prevented from occurring in the second Al-based electrode. As such, even if a pretreatment agent for electroless plating is supplied to the second Al-based electrode, the agent can be prevented from reaching the semiconductor layer. Thereby, the semiconductor layer can be prevented from suffering damages during the electroless plating of a plated layer. Further, since the first Al-based electrode can be directly connected to the semiconductor layer (the second conductivity type semiconductor region), it is possible to suppress the contact resistance of a surface electrode with respect to the semiconductor layer to a lower level.

BRIEF DESCRIPTION OF THE DRAWINGS

FIGS. 4A-4H are views illustrating part of steps of manufacturing the pn diode shown in FIG. 1.

DESCRIPTION OF EMBODIMENTS

Hereinafter, an embodiment according to the present invention is described in detail with reference to the attached drawings.

Figure 1:
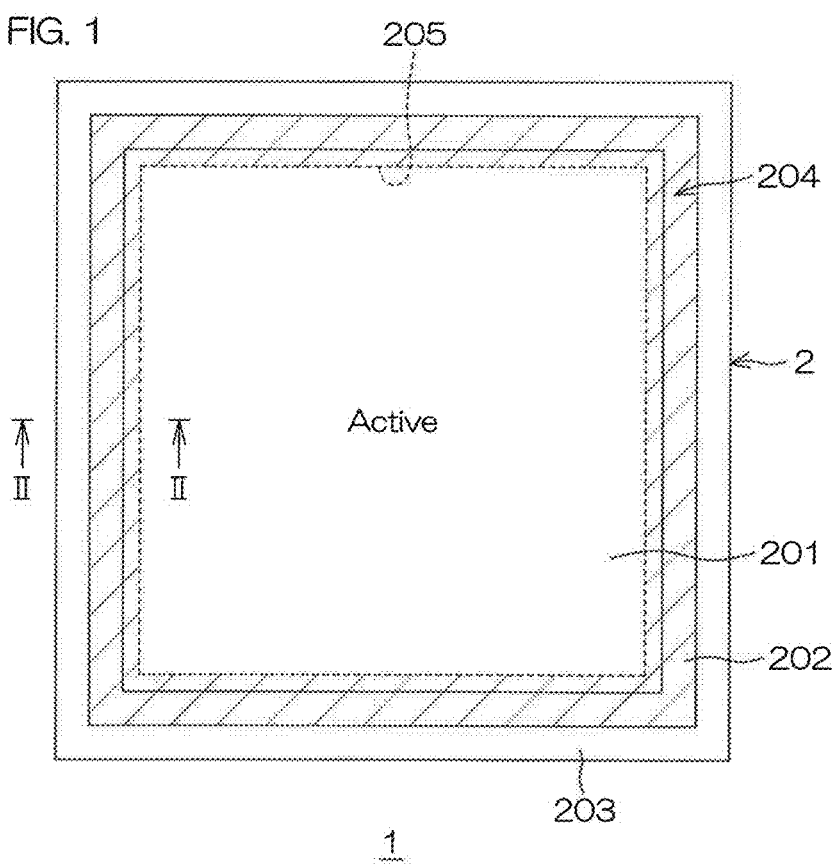
FIG. 1 is a schematic plan view of a pn diode according to an embodiment of the present invention.
Figure 2:
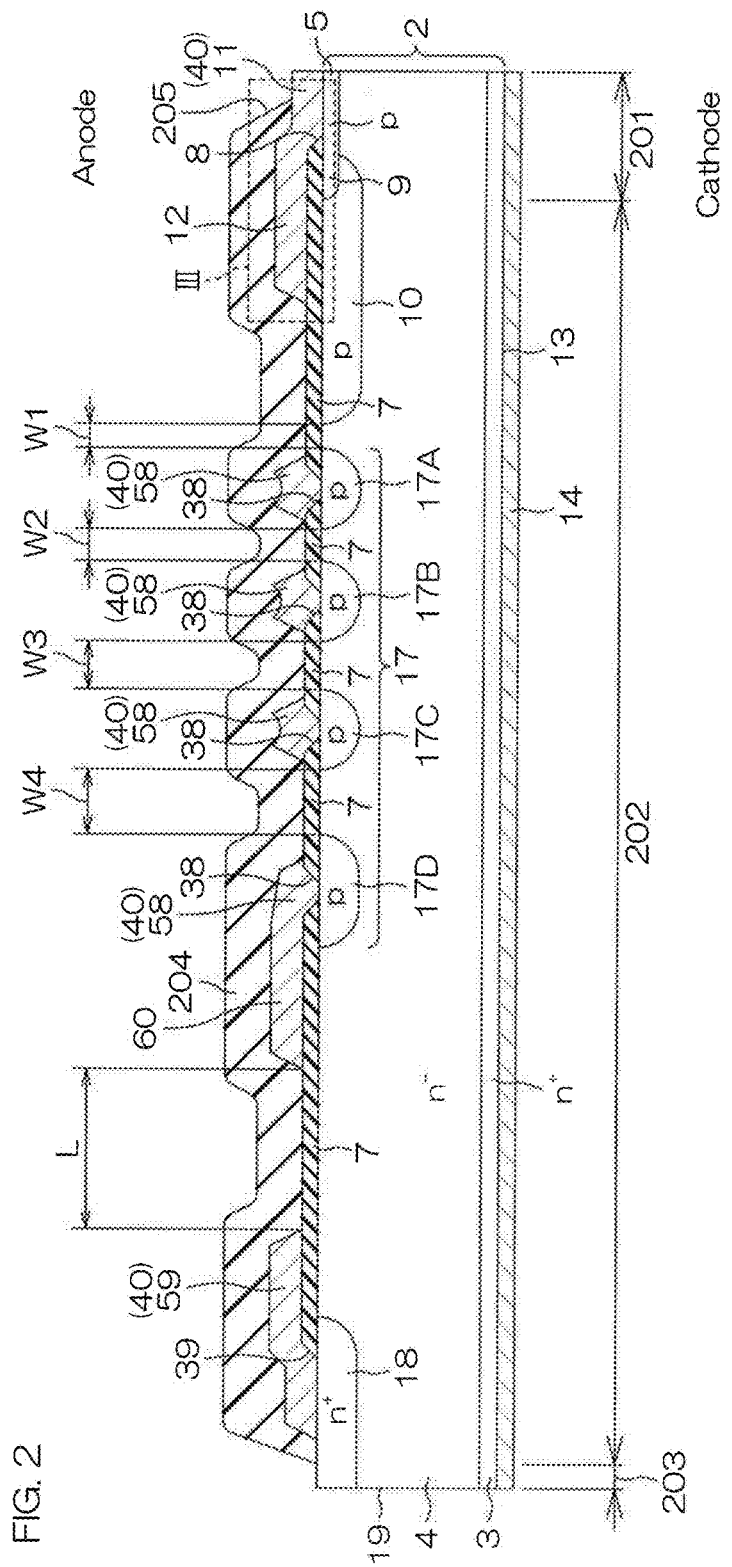
FIG. 2 is a cross-sectional view taken along the line II-II shown in FIG. 1.

FIG. 1 is a schematic plan view of a pn diode 1 according to an embodiment of the present invention. FIG. 2 is a cross-sectional view taken along the line II-II shown in FIG. 1.

The pn diode 1 is formed into a chip having a square shape in plan view or a rectangular shape in plan view. The chip size may be, for example, 1.0 mm×1.0 mm–20 mm×20 mm. The pn diode 1 includes an active region 201, an outer peripheral region 202 surrounding the active region 201, and a scribing region 203 surrounding the outer peripheral region 202. A surface protective film 204 (hatched portion in FIG. 1) is formed to cover the active region 201 and the outer peripheral region 202 while exposing the scribing region 203. Further, the surface protective film 204 has an opening 205 exposing a portion of an anode electrode 11 (discussed below) as a pad.

The pn diode 1 includes a semiconductor layer 2. The semiconductor layer 2 includes an $n^+$ type region 3 and an $n^-$ type region 4 as examples of a first conductivity type semiconductor region according to the present invention. The semiconductor 2 may be constituted by epitaxially growing the $n^-$ type region 4 on the $n^+$ type region 3 as a base substrate.

In the active region 201, a p-type region 5 is formed on the semiconductor layer 2. The p-type region 5 may be an impurity diffusion layer selectively formed in the surface part of the $n^-$ type region 4. Thereby, a pn junction is formed between the p-type region 5 and the $n^-$ type region 4 in the semiconductor layer 2.

In the outer peripheral region 202, a p-type well 10 and a p-type field limiting ring (FLR) 17 are formed in the surface part of the n type region 4. The p-type well 10 is annularly formed having an outer diameter larger than the diameter of the p-type region 5, and is disposed so as to entirely cover the periphery 9 of the p-type region 5 from the bottom. Further, the outer periphery of the p-type well 10 is disposed outside the outer periphery of the p-type region 5.

A plurality of the p-type field limiting ring 17 is formed to surround the p-type well 10. In this embodiment, the p-type FLR 17 includes four p-type FLRs 17A to 17D in that order in a direction away from the p-type well 10 from the position nearest to the p-type well 10. The intervals W1 to W4 between mutually adjacent p-type FLRs 17 (the innermost p-type FLR 17A forms the interval W1 with the p-type well 10) are made wider in a direction away from the p-type well 10 from the position nearest to the p-type well 10. For example, the intervals W1, W2, W3, and W4 may be approximately 15 μm, 17 μm, 19 μm, and 23 μm, respectively.

Further, in the outer peripheral region 202, an $n^+$ type channel stop region 18 is formed in the surface part of the $n^-$ type region 4. The $n^+$ type channel stop region 18 may be formed to extend from the outer peripheral region 202 to reach the end surface 19 of the semiconductor layer 2.

A field insulating film 7 is formed on the surface 6 of the semiconductor layer 2. The field insulating film 7 has a contact hole 8 to selectively expose the p-type region 5. The p-type region 5 is formed entirely in the inner region of the contact hole 8 and extends outward across the contact hole 8. Thereby, the periphery 9 of the p-type region 5 is covered with the field insulating film 7. Further, the contact hole 8 may have a tapered lateral surface in which the diameter thereof is narrowed from the opening end toward the surface 6 of the semiconductor layer 2.

Further, the field insulating film 7 has a contact hole 38 for selectively exposing the p-type FLR 17, and an outer periphery removing region 39 for selectively exposing the n+ type channel stop region 18.

An electrode film 40 is selectively formed on the surface 6 of the semiconductor layer 2. The electrode film 40 includes an anode electrode 11, a field plate 58, and an equipotential ring (EQR) electrode 59 as examples of the surface electrode according to the present invention.

The anode electrode 11 is connected to the p-type region 5 in the contact hole 8 of the field insulating film 7. Further, the anode electrode 11 has an overlap portion 12 that gets on the field insulating film 7 from the contact hole 8 and faces the periphery 9 of the p-type region 5 and the p-type well 10 with the field insulating film 7 interposed therebetween. The position of the outer perimeter of the overlap portion 12 may be in between the outer perimeter of the p-type region 5 and the outer perimeter of the p-type well 10.

Each of the field plates 58 is made corresponding to each of the p-type FLRs 17A to 17D. Each field plate 58 is connected to the p-type FLRs 17A to 17D in the contact holes 38 of the field insulating film 7. The field plate 58 connected to the p-type FLR 17D at the outermost location has an extension portion 60 extending toward the end surface 19 on the field insulating film 7. The length of the extension portion 60 may be, for example, approximately 50 μm.

An EQR electrode 59 is connected to the n+ type channel stop region 18 in the outer periphery removing region 39 of the field insulating film 7. Further, the distance L (insulating distance) between the inner peripheral edge of the EQR electrode 59 and the outer peripheral edge of the outermost field plate 58 may be, for example, 30 μm to 60 μm.

The surface protective film 204 is formed to cover the electrode film 40.

A cathode electrode 14 as an example of the surface electrode according to the present invention is formed on the rear surface 13 of the semiconductor layer 2. The cathode electrode 14 is connected to the n+ type region 3 on the rear surface 13 of the semiconductor layer 2.

Each part of the pn diode 1 is described in detail bellow.

The semiconductor layer 2 is made of a semiconductor material including Si, and may be specifically made of Si or SiC.

The n+ type region 3, the n− type region 4, and the n+ type channel stop region 18 are semiconductor regions containing n-type impurities. As the n-type impurities contained, for example, nitrogen (N), phosphorus (P), arsenic (As) and so forth may be employed (hereinafter, n-type impurities represent the same elements). Further, the impurity concentration of the n+ type region 3 may be, for example, $1 \times 10^{17}$ cm$^{-3}$ to $1 \times 10^{22}$ cm$^3$; the impurity concentration of the n− type region 4 may be, for example, $1 \times 10^{13}$ cm$^{-3}$ to $1 \times 10^{15}$ cm$^{-3}$; and the impurity concentration of the n+ type channel stop region 18 may be, for example, $1 \times 10^{17}$ cm$^{-3}$ to $1 \times 10^{22}$ cm$^{-3}$. Further, the thickness of the n+ type region 3 may be, for example, 0.3 μm to 600 μm, and the thickness of the n− type region 4 may be, for example, 30 μm to 300 μm. Further, the depth of the n+ type channel stop region 18 from the surface 6 may be, for example, 2 μm to 3 μm.

The p-type region 5, the p-type well 10, and the p-type FLR 17 are semiconductor regions containing p-type impurities. As the p-type impurities contained, for example, boron (B), aluminum (Al), argon (Ar) and so forth may be employed (hereinafter, p-type impurities represent the same elements). Further, although the impurity concentration of the p-type region 5, the p-type well 10, and the p-type FLR 17 is, for example, $1 \times 10^{15}$ cm$^{-3}$ to $1 \times 10^{20}$ cm$^{-3}$, in this embodiment, the impurity concentration of the p-type region 5 is lower than the impurity concentration of the p-type well 10 and the p-type FLR 17 within this range. Also, the depth of the p-type region 5 from the surface 6 is shallower than that of the p-type well 10 and the p-type FLR 17. The depth of the p-type region 5 is, for example, 1 μm to 3 μm. Meanwhile the p-type well 10 and the p-type FLR 17 have the same depth from the surface 6, that may be, for example, 6 μm to 10 μm.

The field insulating film 7 may be composed of, for example, silicon oxide (SiO$_2$), and may be formed by, for example, thermal oxidation or chemical vapor deposition (CVD). The thickness of the field insulating film 7 may be, for example, 0.5 μm to 5.0 μm.

The surface protective film 204 may be composed of, for example, polyimide, and may be formed by spin coating.

Next, the structures of the anode electrode 11, the cathode electrode 14, the field plate 58 and the EQR electrode 59 are described in detail with reference to FIG. 3.

Hereinafter, the structure of the anode electrode 11 is described as an example, and the cathode electrode 14, the field plate 58 and the EQR electrode 59 are not discussed. However, the same structure of the anode electrode 11 can also be applied to those of the cathode electrode 14, the field plate 58 and the EQR electrode 59.

Figure 3:
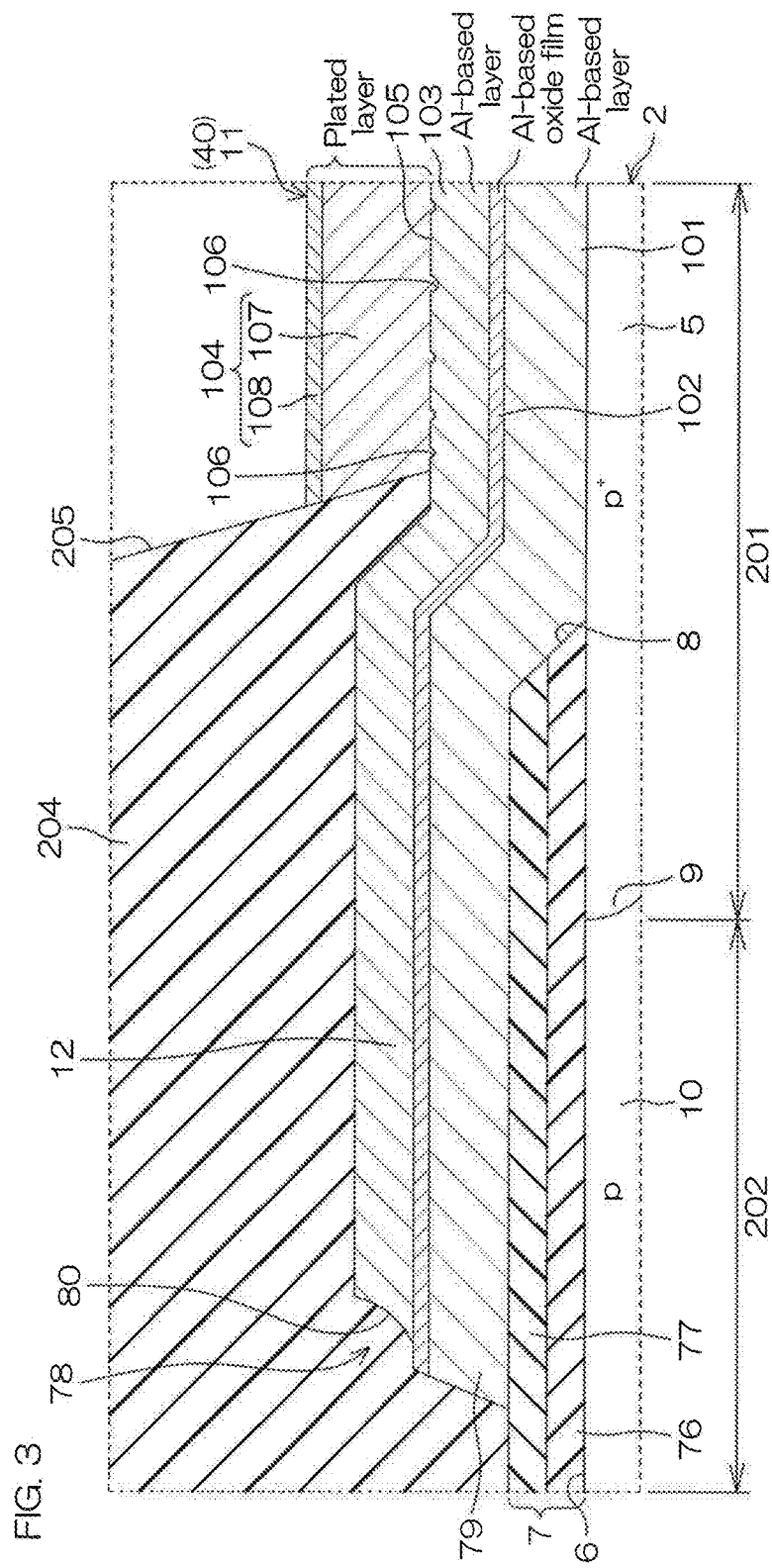
FIG. 3 is an enlarged view of a region surrounded by the broken line III shown in FIG. 2.

FIG. 3 is an enlarged view of a region surrounded by the broken line III shown in FIG. 2.

The field insulating film 7 may include a bottom-layered film 76 made of, for example, SiO$_2$, and a top-layered film 77 made of, for example, PSG.

The anode electrode 11 includes a first Al-based electrode 101, an Al-based oxide film 102, a second Al-based electrode 103, and a plated layer 104 laminated in order from the surface 6 of the semiconductor layer 2. The first Al-based electrode 101, the Al-based oxide film 102, and the second Al-based electrode 103 are formed between the semiconductor layer 2 and the surface protective film 204, and the plated layer 104 is formed in the opening 205 of the surface protective film 204.

The first Al-based electrode 101 is an electrode layer in direct contact with and electrically connected to the p-type region 5 of the semiconductor layer 2, and has a thickness of, for example, 3.0 μm to 5.0 μm. The first Al-based electrode 101 is made of a metal containing Al as a principal component. Specifically, the first Al-based electrode 101 may be made of at least one material selected from a group of Al, AlSi, AlCu, and AlSiCu.

The Al-based oxide film 102 is formed in direct contact with the first Al-based electrode 101 in FIG. 3. The Al-based oxide film 102 is a oxide thin film which is made thin enough so that currents can flow in the thickness direction by tunnel effect, and has a thickness of, for example, 10 Å to 40 Å. The Al-based oxide film 102 is made of aluminum oxide, and may be specifically made of Al$_2$O$_3$, Al$_2$O$_3$.3H$_2$O and so forth.

Although the second Al-based electrode 103 is formed in direct contact with the Al-based oxide film 102 in FIG. 3, the embodiment according to the present invention is not limited to this, and for example, a metal layer except for the Al-based metal layer may be provided between the Al-based oxide film 102 and the second Al-based electrode 103. The second Al-based electrode 103 is thinner than the first Al-based electrode 101, and has a thickness of, for example, 1.0 μm to 2.0 μm. The second Al-based electrode 103 is made of a metal containing Al as a principal component, and may be specifically made of at least one material selected from a group of Al, AlSi, AlCu, and AlSiCu. That is, both of the first Al-based electrode 101 and the second Al-based electrode 103 may be constituted by the Al-based material selected from a group of Al, AlSi, AlCu, and AlSiCu. These first and second Al-based electrodes 101, 103 may be constituted by the same material, or may be constituted by mutually different materials. For example, both the first and second Al-based electrodes 101, 103 may be made of AlSi, or the first Al-based electrodes 101 may be made of AlSi, while the second Al-based electrodes 103 may be made of AlCu. The Al-based material employed may be selected considering, for example, the ohmic characteristics with respect to the semiconductor layer 2, and adhesion with the Al-based oxide film 2, the plated layer 104 and so forth.

Further, the second Al-based electrodes 103 has fine irregularities 106 at a boundary portion 105 with the plated layer 104. The fine irregularities 106 are formed during the pretreatment of electroless plating described later, and are irregularly dispersed entirely over the exposed surface of the second Al-based electrodes 103 in the opening 205 of the surface protective film 204. The depth of the fine irregularities 106 is small enough to not have an effect on the characteristics of the second Al-based electrodes 103, which, for example, is less than 5% of the thickness of the second Al-based electrodes 103.

Further, the laminate structure of the first Al-based electrode 101, the Al-based oxide film 102, and the second Al-based electrode 103 has a step portion 78 at the end of the field insulating film 7. The step portion 78 is formed by the first Al-based electrode 101 and the Al-based oxide film 102 extending outward (toward the end surface 19) from the second Al-based electrode 103 as a flange portion 79. An arc surface 80 is formed as the end surface of the second Al-based electrode 103 above the flange portion 79. The arc surface 80 has a shape recessed inward the second Al-based electrode 103. The arc surface 80 makes it possible to improve the adhesion between the surface protective film 204 and the anode electrode 11. Such step structures at edges are also formed at the edges of the field plate 58 and the EQR electrode 59 having the edges in the region on the semiconductor layer 2.

The plated layer 104 may be composed of a plurality of layers as shown in FIG. 3. The plurality of layers may include an Ni layer 107 formed in direct contact with the second Al-based electrode 103 and an Au layer 108 on the Ni layer 107. In this case, the Au layer 108 defines the outermost surface of the anode electrode 11. The structure of the plated layer 104 is not limited to the structure composed of the Ni layer 107 and the Au layer 108, and may be, for example, a three-layered structure in which an Ni layer, a Pd layer, and an Au layer are laminated in order from the second Al-based electrode 103. Further, the plated layer 104 has a thickness of, for example, 2.0 μm to 5.0 μm. In the structure shown in FIG. 3, the thickness of the Ni layer 107 is, for example, 2.0 μm to 4.9 μm, and the thickness of the Au layer 108 may be thinner than the Ni layer 107, having a thickness of, for example, 0.01 μm to 0.2 μm.

Further, when the cathode electrode 14 has the same structure as that of the anode electrode 11, the cathode electrode 14 may include the first Al-based electrode 101, the Al-based oxide film 102, the second Al-based electrode 103, and the plated layer 104 laminated in order from the rear surface 13 of the semiconductor layer 2.

Next, a method for manufacturing the pn diode 1 shown in FIG. 1. FIGS. 4A-4H are views illustrating steps of manufacturing the pn diode 1 shown in FIG. 1 in order of steps.

When manufacturing the pn diode 1, the n⁻ type region 4 is formed on the n⁺ type region 3 as a base substrate (semiconductor wafer), for example, by epitaxial growth. Next, the p-type region 5, the p-type well 10, the p-type FLR 17, and the n⁺ type channel stop region 18 are formed in the surface part of the n⁻ type region 4 by ion injection and annealing treatment. Next, the field insulating film 7 having the contact hole 8 is formed on the surface 6 of the semiconductor layer 2.

Figure 4A:
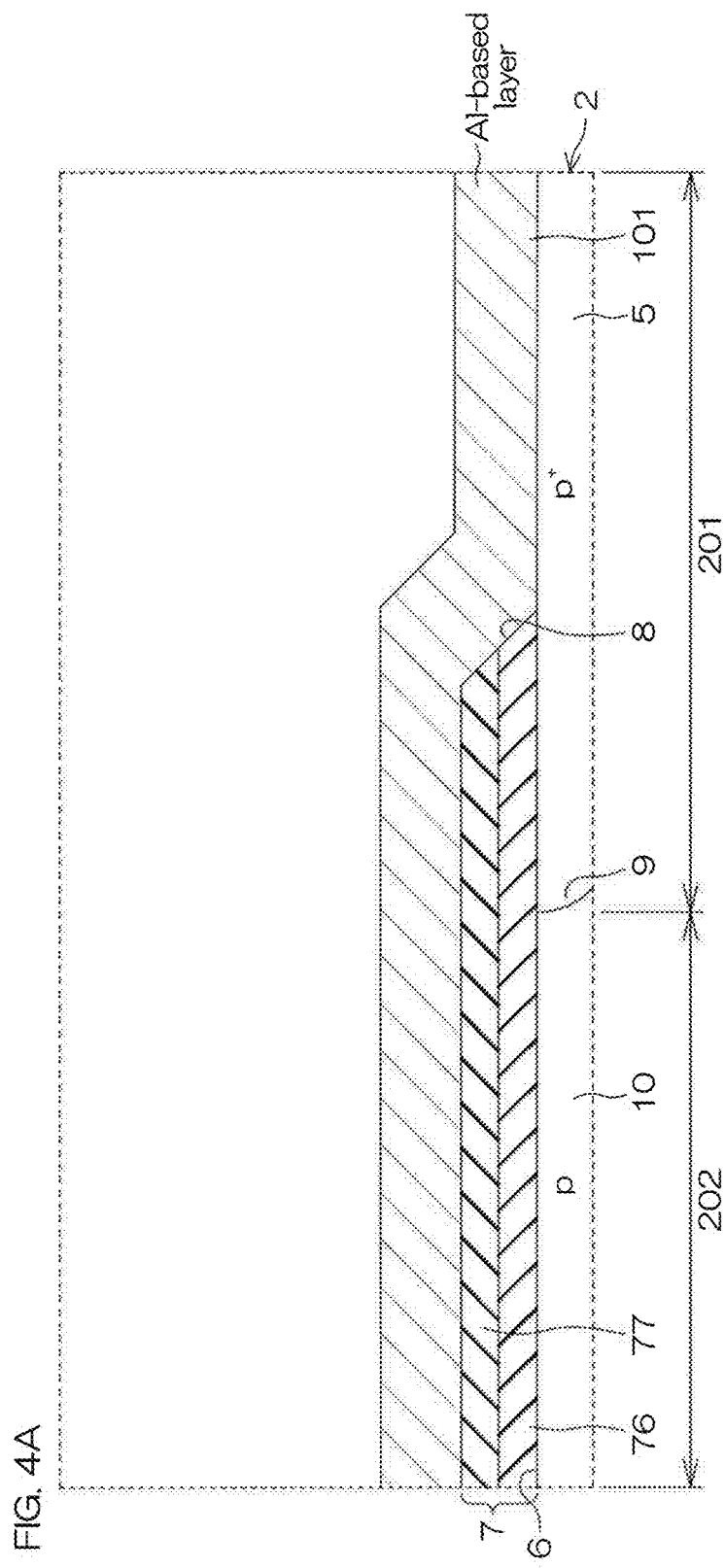

Next, as shown in FIG. 4A, an Al-based electrode material is deposited on the semiconductor layer 2, for example, by sputtering, to thereby form a first Al-based electrode 101. The first Al-based electrode 101 enters the contact hole 8 and is connected to the p-type region 5.

Figure 4B:
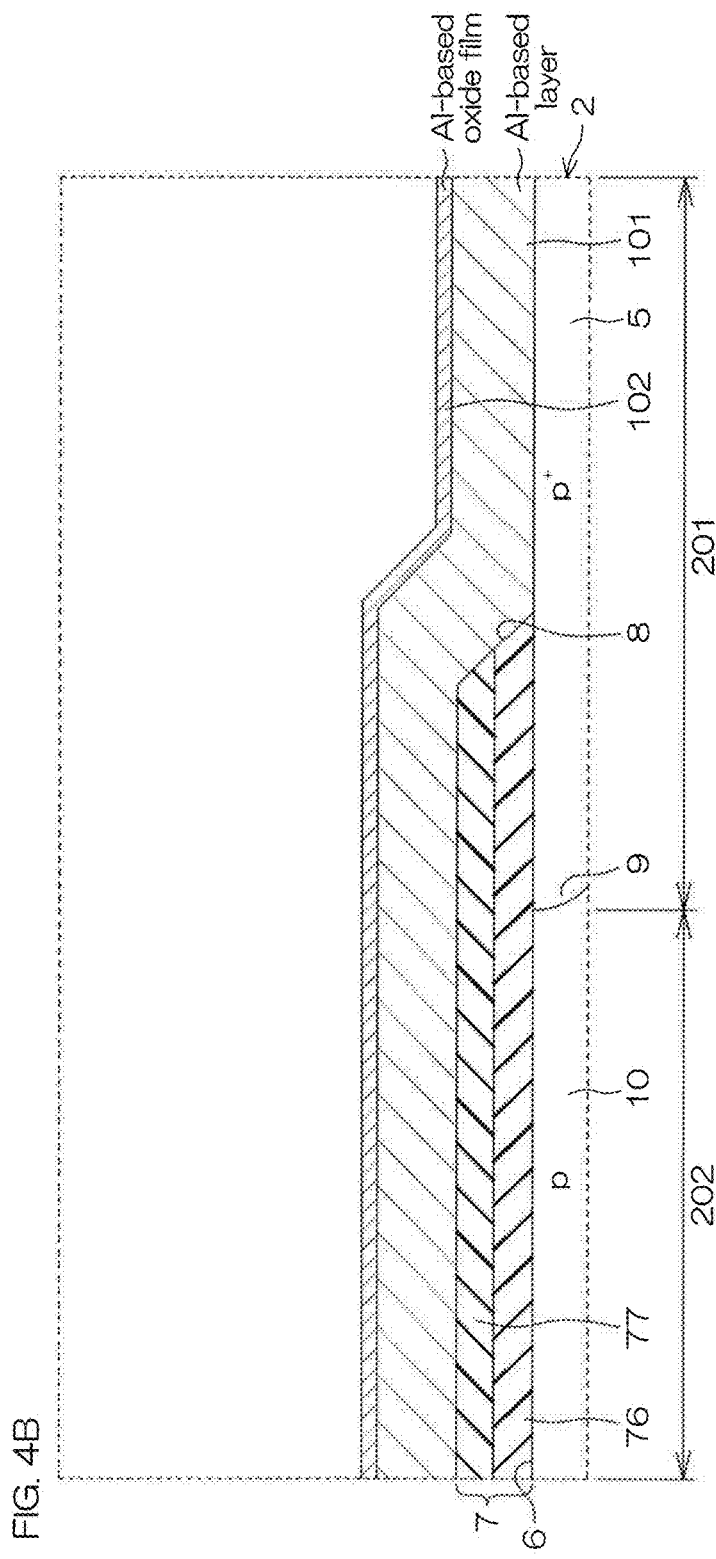

Next, the semiconductor layer 2 (semiconductor wafer in which an epitaxial layer is formed) after the formation of the first Al-based electrode 101 is taken out from a chamber for sputtering, so that the surface of the first Al-based electrode 101 is oxidized. The surface of the first Al-based electrode 101 may be forcibly oxidized, for example, by heat treating the semiconductor wafer in the atmosphere, or may be naturally oxidized by being left exposed to the air. Further, the Al-based oxide film 102 may be formed by deposition instead of the surface oxidization of the first Al-based electrode 101. Thereby, the Al-based oxide film 102 is formed on the first Al-based electrode 101 as shown in FIG. 4B.

Figure 4C:
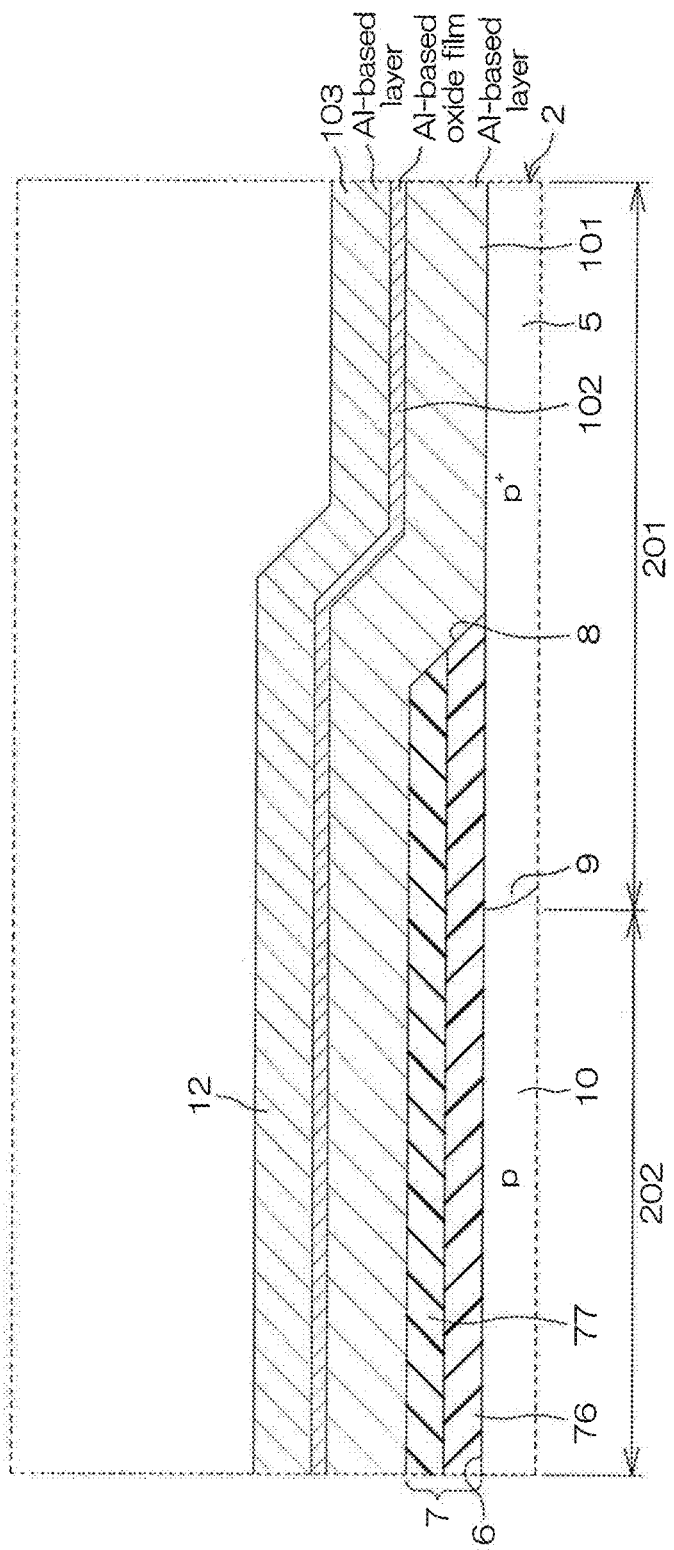

Next, as shown in FIG. 4C, the second Al-based electrode 103 is formed by depositing an Al-based electrode material on the Al-based oxide film 102, for example, using sputtering.

Then, the first Al-based electrode 101 and the second Al-based electrode 103 are subjected to annealing treatment. The first and second Al-based electrodes may be annealed under the conditions of, for example, one atmospheric pressure in the atmosphere of hydrogen gas, nitrogen gas, or the mixed gas of these gases, at 300° C. to 500° C. for 10 minutes to 180 minutes. By being left to stand, for example, for 1 hour to 3 hours after the annealing treatment is finished, the first Al-based electrode 101 and the second Al-based electrode 103 are naturally cooled.

Figure 4D:
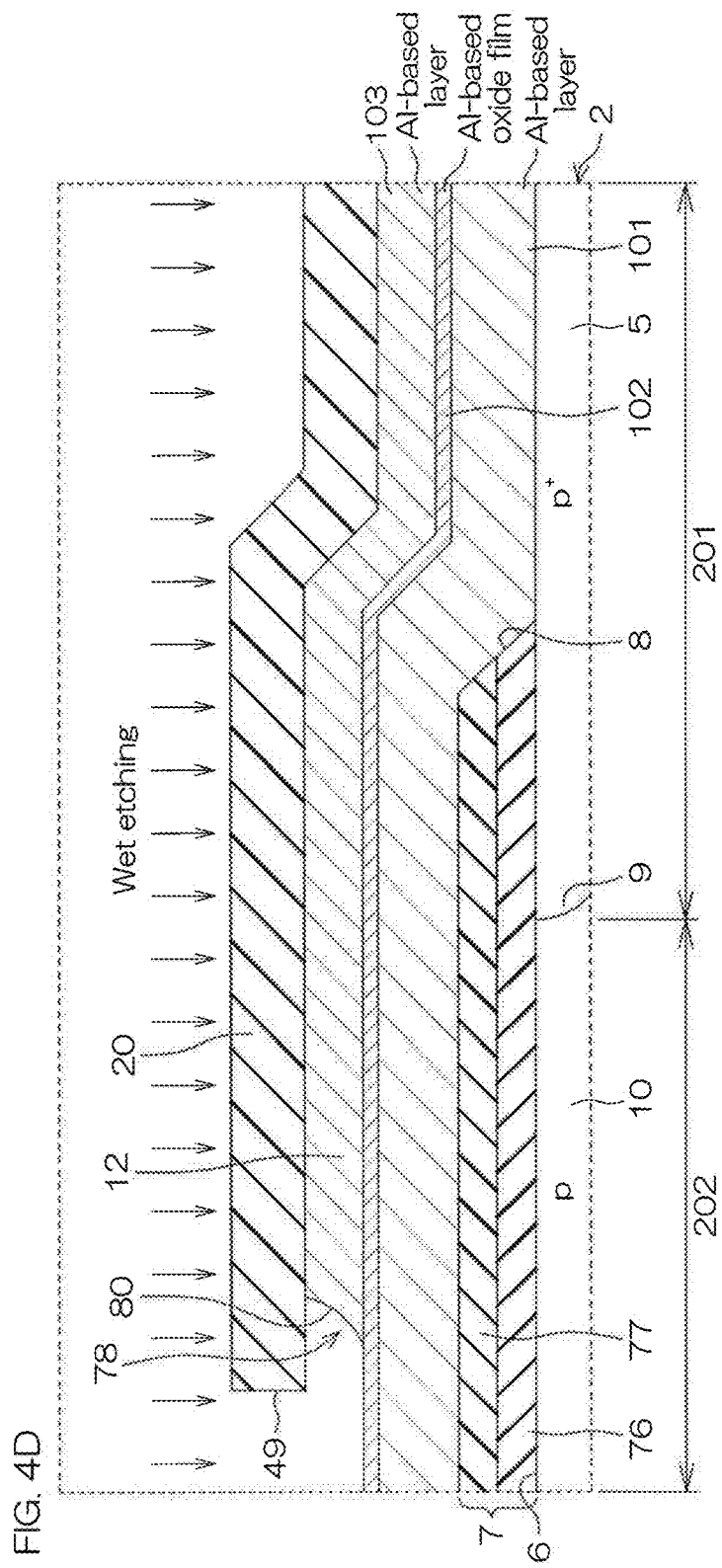

Next, as shown in FIG. 4D, a mask 20 selectively having openings 49 is formed on the second Al-based electrode 103, and the second Al-based electrode 103 is etched through the mask 20. Etching is performed by, for example, a wet etching. An etching liquid containing, for example, $H_3PO_4$, $HNO_3$, $CH_3COOH$ and so forth can be used for the wet etching. Thereby, the second Al-based electrode 103 is isotropically etched, and the arc surface 80 is formed with the end surface thereof eroded inward from the opening 49. At this time, the Al-based oxide film 102 functions as an etching stopper for stopping the wet etching.

Next, as shown in FIG. 4E, the Al-based oxide film 102 and the first Al-based electrode 101 are etched in order by dry etching (for example, reactive ion etching: RIE) using the same mask 20. For example, fluorine-containing gases (for example, HF) can be used for the Al-based oxide film 102, and chlorine-containing gases (for example, $Cl_2+BCl_3$, $Cl_2+CCl_4$) can be used for the first Al-based electrode 101 as etching gases for dry etching. In the dry etching, the Al-based oxide film 102 and the first Al-based electrode 101 are anisotropically etched in the thickness direction. Thereby, the Al-based oxide film 102 and the first Al-based electrode 101 extend outward from the second Al-based electrode 103 as the flange portion 79, and thus the flange portion 79 has an end surface substantially matching the outline of the opening 49 of the mask 20.

Figure 4F:
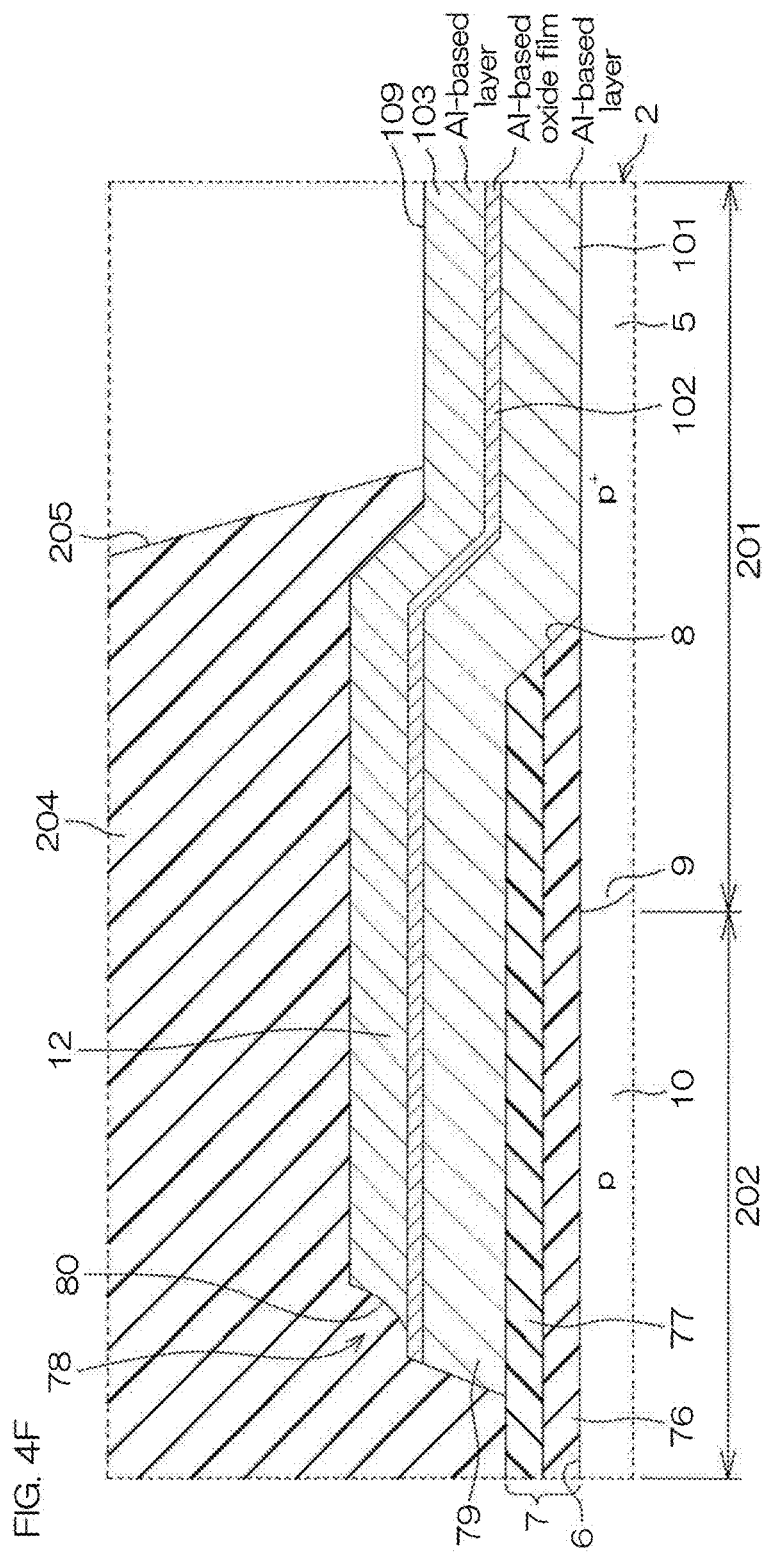

Next, as shown in FIG. 4F, the surface protective film 204 is formed on the semiconductor layer 2 by, for example, spin coating. Then, the surface protective film 204 is selectively removed to thereby form an opening 205 for exposing part of the surface 109 of the second Al-based electrode 103.

Figure 4G:
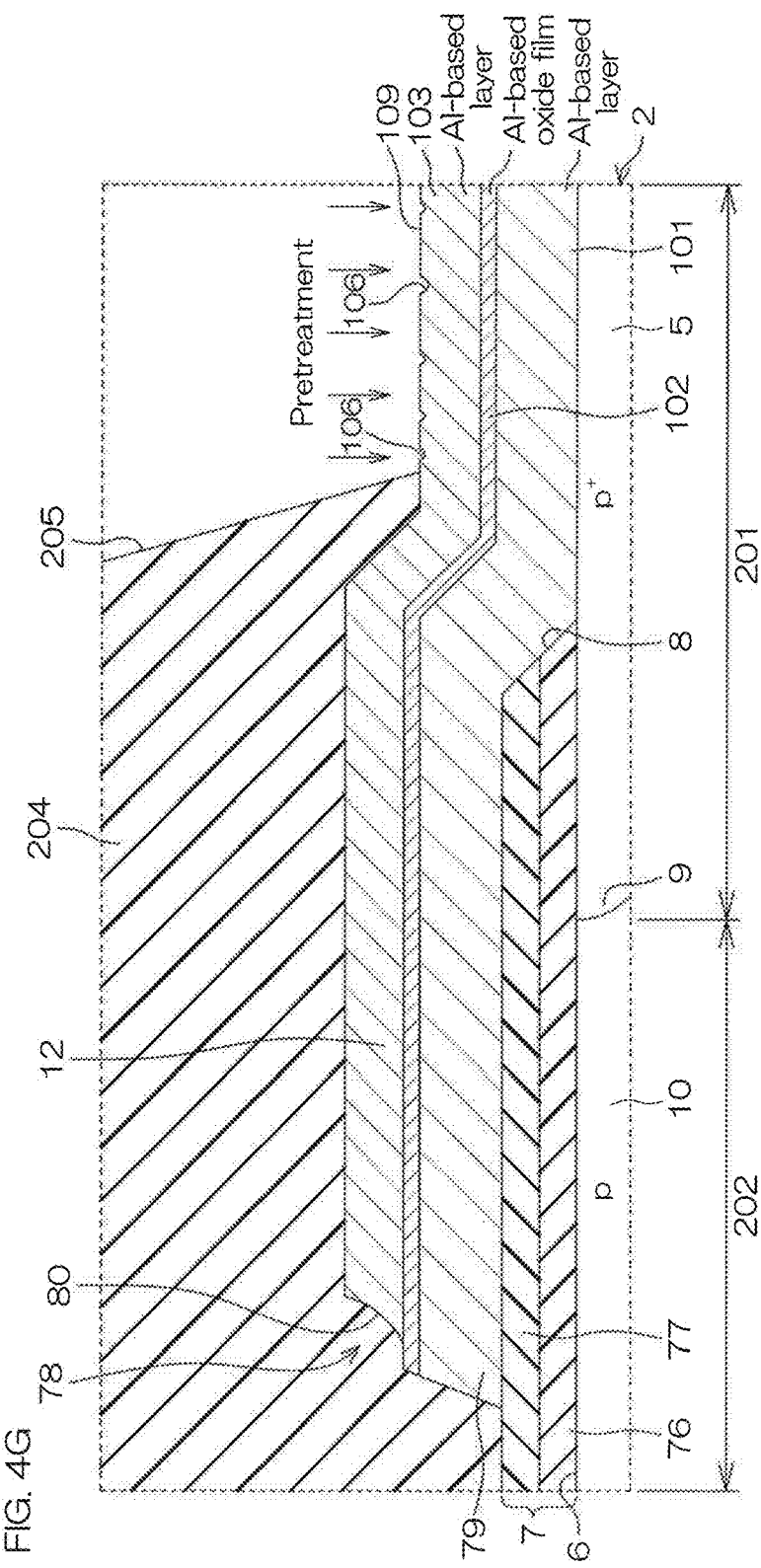

Next, as shown in FIG. 4G, the pretreatment prior to electroless plating is performed. First, oil adhered to the surface 109 of the second Al-based electrode 103 is removed during the pretreatment using, for example, an alkaline based degreasing agent and so forth (surface cleaning). Next, an alkaline based agent (for example, a solution containing NaOH) is supplied to the surface 109 of the second Al-based electrode 103 to thereby remove an oxide film formed by natural oxidation processes on the surface 109, while etching the surface 109 of the second Al-based electrode 103. Thereby, the fine irregularities 106 are formed on the surface 109. Next, the impurities generated when removing the oxide film is removed using an acid-based agent (for example, a solution containing nitric acid, fluoride and so forth) (acid cleaning).

Next, zincate treatment is performed. For example, a double-zincate method, which is two-stage zinc substitution treatment, can be applied to this embodiment. More specifically, first, the surface 109 of the second Al-based electrode 103 is treated by using a zincate solution (for example, a solution containing NaOH and ZnO), and thus a relatively large Zn particles are precipitated on the surface 109. Next, the Zn particles on the surface 109 are dissolved by using an acid-based agent (for example, a nitric acid solution), and then the zincate solution (for example, a solution containing NaOH and ZnO) is again supplied. Thereby, a coating film with finer Zn particles can be formed on the surface 109.

Figure 4H:
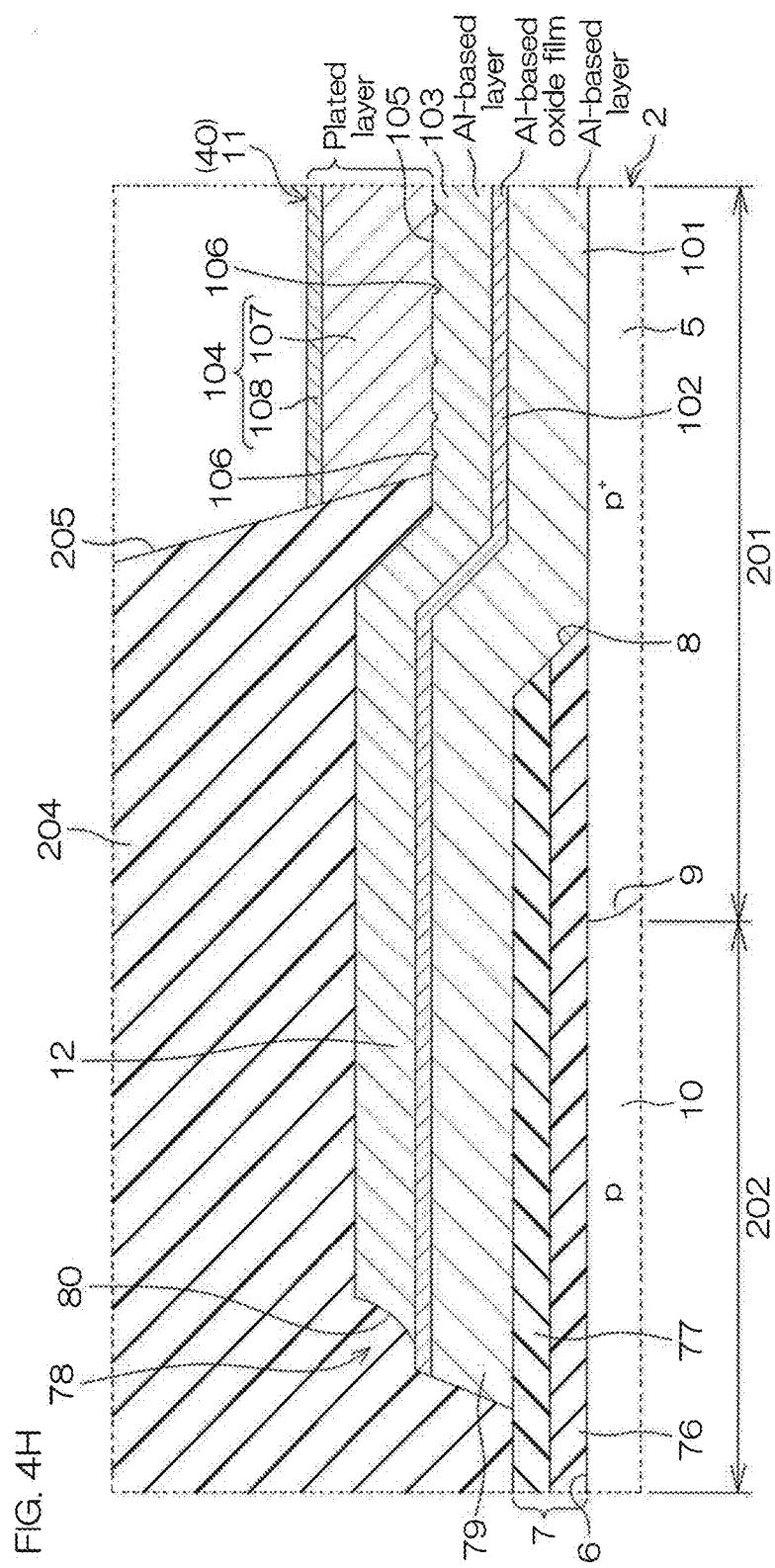

Next, a semiconductor wafer (not shown) is immersed into a nickel plating solution for electroless plating, and thereby causes the Zn coating film formed in the previous step to be replaced by nickel in the plating solution. Thereafter, the plating reaction progresses with the nickel as a catalyst that is replaced from the zinc film. Thereby, an Ni layer 107 is formed on the second Al-based electrode 103 as shown in FIG. 4H. Thereafter, the semiconductor wafer (not shown) is transferred to and immersed into a plating bath in which an Au plating solution is stored to thereby form an Au layer 108 on the Ni layer 107. As such, the anode electrode 11 is formed. Further, when the cathode electrode 14 has the same structure as the anode electrode 11, the anode electrode 11 and the cathode electrode 14 may be formed at the same time. Further, the field plate 58 and the EQR electrode 59 are formed in the same step as that of the anode electrode 11.

Thereafter, the semiconductor wafer is diced into each chip with different sizes, and thus the pn diode 1 shown in FIG. 1 is produced.

Figure 5A:
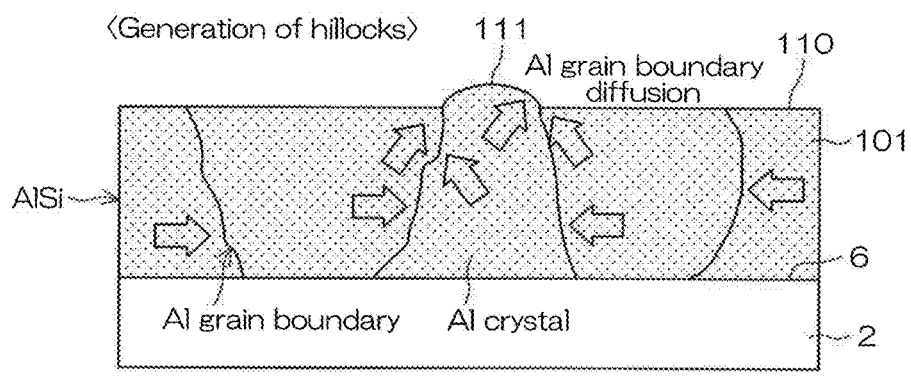
FIG. 5A is a view illustrating the process of heat treatment (during heating) of an Al-based electrode.
Figure 5B:
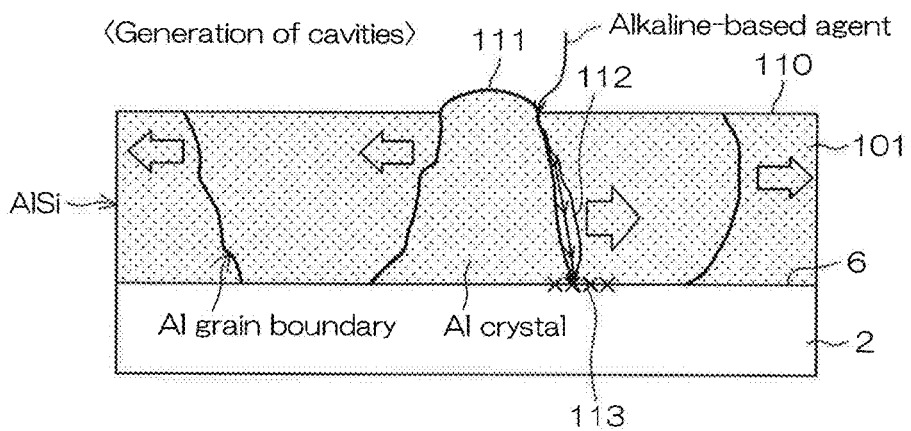
FIG. 5B is a view illustrating the process of heat treatment (during cooling) of an Al-based electrode.

According to the steps described above, for example, if the Al-based electrode is a single layer structure of the first Al-based electrode 101, when the first Al-based electrode 101 is subjected to the annealing treatment after the formation of the first Al-based electrode 101 in the step shown in FIG. 4A, a compression stress is generated in the first Al-based electrode 101 due to the difference of the linear expansion coefficient between Al and Si as shown in FIG. 5A, so that Al is subjected to plastic deformation (thermal expansion) and part of Al may be pushed out to an Al surface 110 to thereby generate hillocks 111 thereon. These hillocks 111 can be generated not only during the annealing of the first Al-based electrode 101 but also during the sintering of the semiconductor wafer. Thereafter, when the temperature of Al decreases (during cooling), Al is contracted due to a tensile stress generated in the first Al-based electrode 101 to thereby generate cavities 112 (or spaces) in a grain boundary under the hillocks 111 as shown in FIG. 5B.

If an Al surface 10 of the first Al-based electrode 101 is etched with an alkaline-based agent in the presence of the cavities 112, the alkaline-based agent remains on the Si surface (surface 6) via the cavities 112. Etching progresses by reaction represented by, for example, $Si+4OH^- \rightarrow Si(OH)_4+4e^-$, and pits (small recesses) 113 may be eventually formed on the Si surface due to the etching.

Figure 6A:
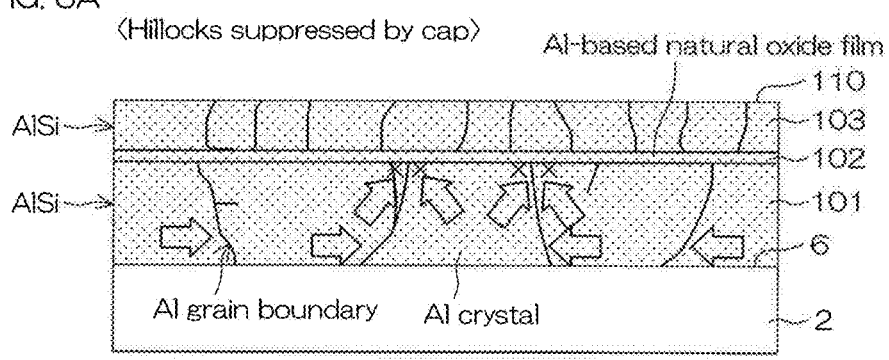
FIG. 6A is a view illustrating the process of heat treatment (during heating) of an Al-based electrode.
Figure 6B:
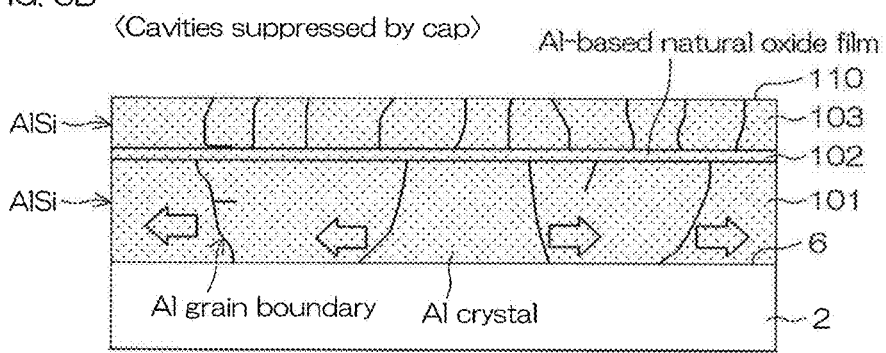
FIG. 6B is a view illustrating the process of heat treatment (during cooling) of an Al-based electrode.

However, in this embodiment, as shown in FIG. 6A and FIG. 6B, the Al-based electrode has a two-layer structure of the first Al-based electrode 101 and the second Al-based electrode 103 with the Al-based oxide film 102 interposed therebetween. The Al-based oxide film 102 functions as a grain boundary separation layer that separates the grain boundary face between the first Al-based electrode 101 and the second Al-based electrode 103. Thereby, even if the first Al-based electrode 101 is subjected to plastic deformation, the second Al-based electrode 103 does not take over the grain boundary of the first Al-based electrode 101, and thus hillocks can be prevented from occurring on the Al surface 110 of the second Al-based electrode 103 that is the outermost surface of the Al-based electrode (FIG. 6A). As a result, cavities or the like, which may form flow passages for an alkaline-based agent after the temperature decreases, are prevented from occurring in the second Al-based electrode 103 (FIG. 6B). As such, even if a pretreatment agent for electroless plating is supplied to the second Al-based electrode 103, the agent can be prevented from reaching the semiconductor layer 2. Thereby, the semiconductor layer 2 can be prevented from suffering damages during the electroless plating of the plated layer 104.

Further, in this embodiment, the first Al-based electrode 101 can be directly connected to the p-type region 5, and thus the contact resistance of the anode electrode 11 with respect to the p-type region 5 can be suppressed to a lower level.

Figure 7:
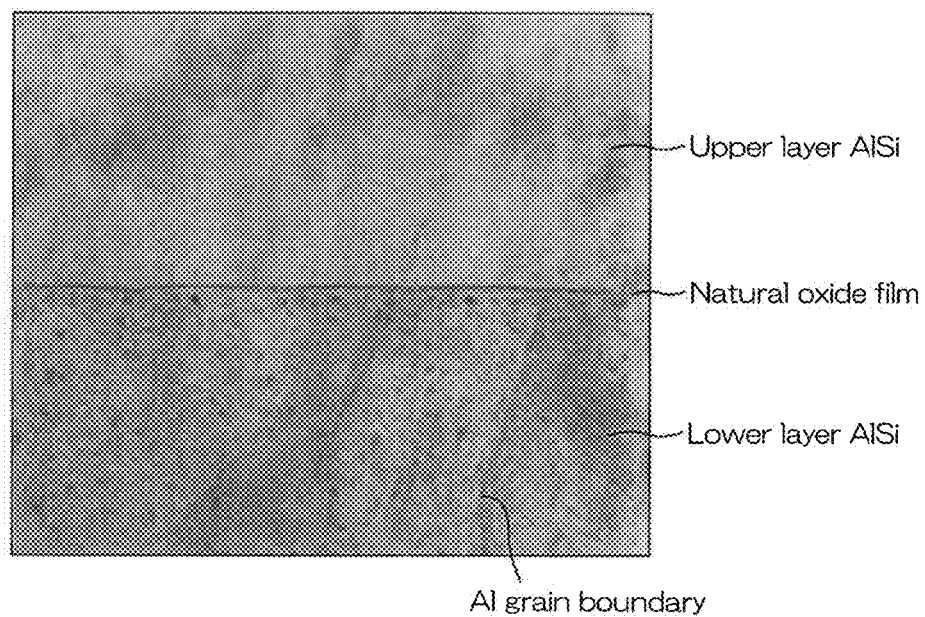
FIG. 7 is a view illustrating a TEM image of the surface electrode structure of an FRD element.

FIG. 7 shows a TEM image of a surface electrode structure of a first recovery diode (FRD) element that is manufactured in accordance with the above described embodiment. As shown in FIG. 7, a laminate structure including a lower layer made of AlSi and an upper layer made of AlSi are formed on the Si substrate (naturally oxide film interposed in between). As is apparent from FIG. 7, the naturally oxide film as the Al-based oxide film serves as a cap covering the surface of the lower layer of AlSi, whereby the lower layer of AlSi and the upper layer of AlSi are shielded from each other. With reference to FIG. 7, it is apparent that the second Al-based electrode 103 does not take over the grain boundary of the first Al-based electrode 101.

Figure 8:
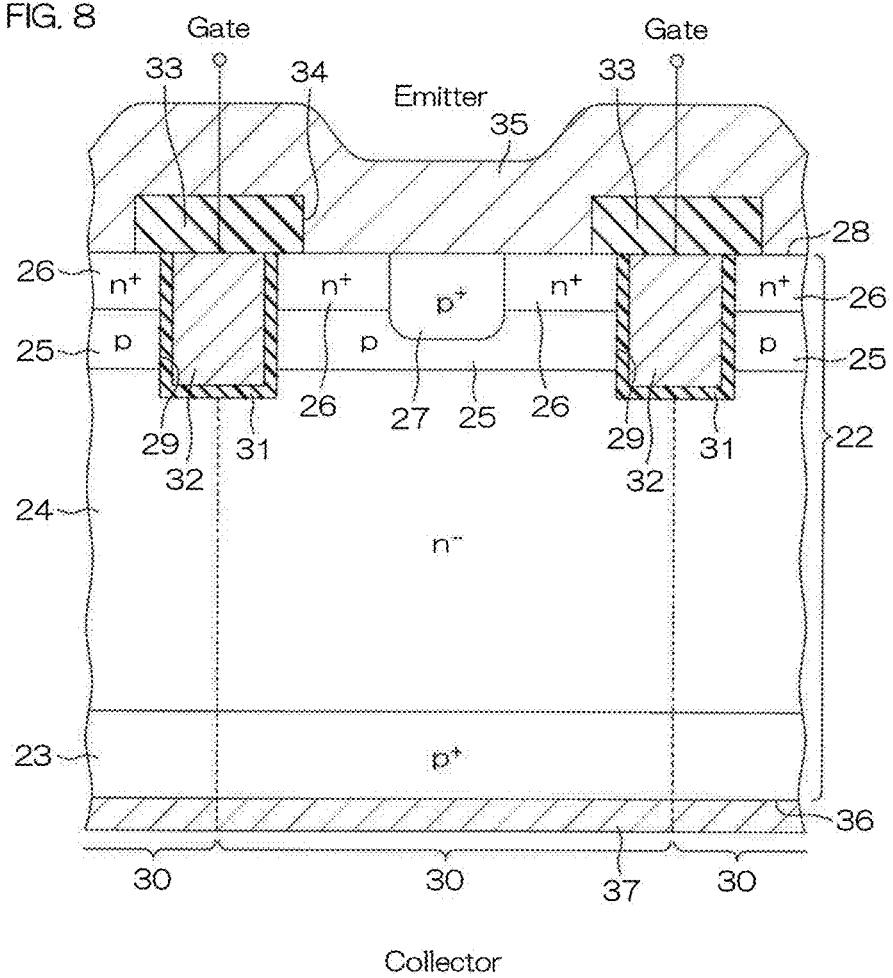
FIG. 8 is a schematic cross-sectional view of an IGBT according to an embodiment of the present invention.
Figure 9:
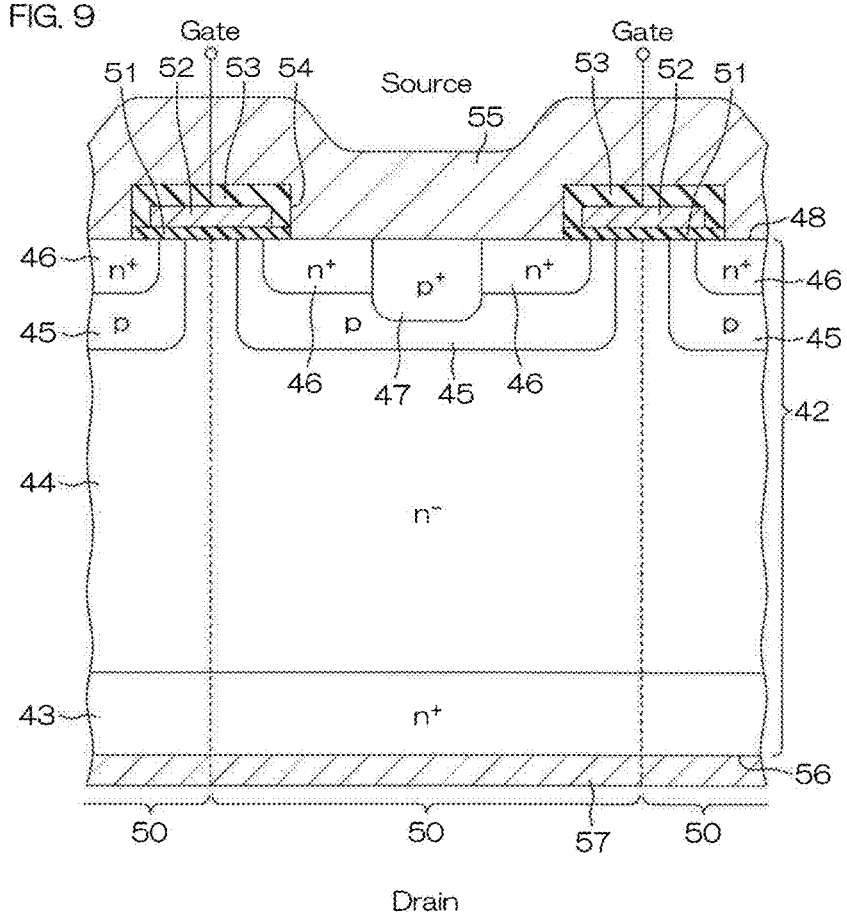
FIG. 9 is a schematic cross-sectional view of a MISFET according to an embodiment of the present invention.
Figure 10:
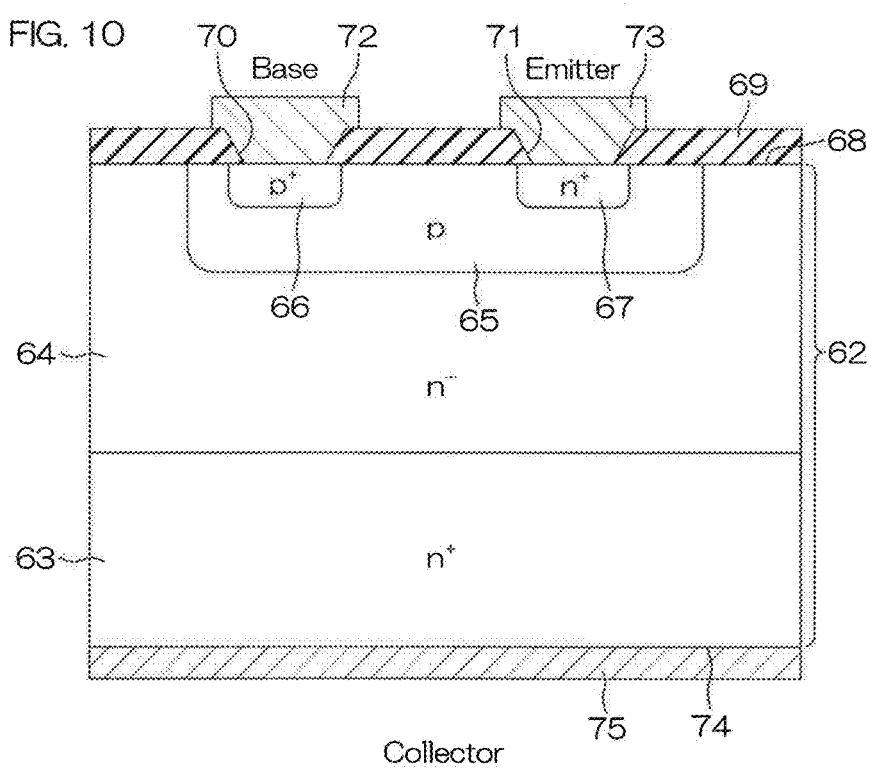
FIG. 10 is schematic cross-sectional view of a bipolar transistor according to an embodiment of the present invention.

Next, an example to which the above described structure of the anode electrode 11 can apply is discussed with reference to FIGS. 8-10. FIGS. 8-10 shows only part of the active region 201 shown in FIGS. 1 and 2, and the outer peripheral region 202 and the scribing region 203 are not described here because they have the same structure as the active region.

FIG. 8 is a schematic cross-sectional view of an IGBT 21 according to an embodiment of the present invention.

The IGBT 21 is a trench gate type IGBT, including a semiconductor layer 22. The semiconductor layer 22 includes a $p^+$ type collector region 23 as an example of the second conductivity type semiconductor region according to the present invention, and an $n^-$ type drift region 24. A p-type base region 25 is formed in the surface part of the $n^-$ type drift region 24. An $n^+$ type emitter region 26 as an example of the first conductivity type semiconductor region according to the present invention is formed in the surface part of the p-type base region 25, and a $p^+$ type base contact region 27 is formed passing through the $n^+$ type emitter region 26 so as to come in contact with the p-type base region 25.

Meanwhile, a gate trench 29 is formed passing through the $n^+$ type emitter region 26 and the p-type base region 25 from the front surface 28 of the semiconductor layer 22. The p-type base region 25 is divided into a plurality of unit cells 30 by the gate trench 29. A gate electrode 32 (for example, poly silicon electrode) is embedded in the gate trench 29 through a gate insulating film 31 made of $SiO_2$ (silicon oxide).

An interlayer insulating film 33 made of, for example, $SiO_2$ (silicon oxide) is formed on the front surface 28 of the semiconductor layer 22 so as to cover the gate electrode 32. The interlayer insulating film 33 has a contact hole 34 for exposing the $n^+$ type emitter region 26 and the $p^+$ type base contact region 27.

An emitter electrode 35 as an example of the surface electrode according to the present invention is formed on the front surface 28 of the semiconductor layer 22. The emitter electrode 35 is connected to the $n^+$ type emitter region 26 and the $p^+$ type base contact region 27 in the contact hole 34 of the interlayer insulating film 33. On the other hand, a collector electrode 37 as an example of the surface electrode according to the present invention is formed on the rear surface 36 of the semiconductor layer 22. The collector electrode 37 is connected to the $p^+$ type collector region 23 on the rear surface 36 of the semiconductor layer 22.

Here, the structure of the anode electrode 11 shown in FIG. 3 is applicable to the emitter electrode 35 and the collector electrode 37 in this IGBT 21. That is, the emitter electrode 35 and the collector electrode 37 may each include the first Al-based electrode 101, the Al-based oxide film 102, the second Al-based electrode 103, and the plated layer 104 laminated in order from the front surface 28 or the rear surface 36 of the semiconductor layer 22.

FIG. 9 is a schematic cross-sectional view of a MISFET 41 according to an embodiment of the present invention.

The MISFET 41 is a planar gate type MISFET, including a semiconductor layer 42. The semiconductor layer 42 includes an $n^+$ type drain region 43 and an $n^-$ type drift region 44. A plurality of p-type body regions 45 is formed in the surface part of the $n^-$ type drift region 44. The semiconductor layer 42 is divided into a plurality of unit cells 50 by the p-type body regions 45. An $n^+$ type source region 46 as an example of the first conductivity type semiconductor region according to the present invention is formed in the surface part of each p-type body region 45, and a $p^+$ type body contact region 47 is formed passing through the $n^+$ type source region 46 so as to come in contact with the p-type body region 45.

A gate electrode 52 (for example, poly silicon electrode) is formed on the front surface 48 of the semiconductor layer 42 through gate insulating film 51 made of, for example, $SiO_2$ (silicon oxide). The gate electrode 52 extends across adjoining p-type body regions 45, facing a channel region between the outer edge of each p-type body region 45 and the $n^+$ type source region 46.

An interlayer insulating film 53 made of, for example, $SiO_2$ (silicon oxide) is formed on the front surface 48 of the semiconductor layer 42 so as to cover the gate electrode 52. The interlayer insulating film 53 has a contact hole 54 for exposing the $n^+$ type source region 46 and the $p^+$ type body contact region 47.

A source electrode 55 as an example of the surface electrode according to the present invention is formed on the front surface 48 of the semiconductor layer 42. The source electrode 55 is connected to the $n^+$ type emitter region 46 and the $p^+$ type base contact region 47 in the contact hole 54 of the interlayer insulating film 53. On the other hand, a drain electrode 57 as an example of the surface electrode according to the present invention is formed on the rear surface 56 of the semiconductor layer 42. The drain electrode 57 is connected to the $n^+$ type drain region 43 on the rear surface 56 of the semiconductor layer 42.

Here, the structure of the anode electrode 11 shown in FIG. 3 is applicable to the source electrode 55 and the drain electrode 57 in this MISFET 41. That is, the source electrode 55 and the drain electrode 57 may each include the first Al-based electrode 101, the Al-based oxide film 102, the second Al-based electrode 103, and the plated layer 104 laminated in order from the front surface 48 or the rear surface 56 of the semiconductor layer 42.

Further, the MISFET 41 may be a MISFET having a trench gate structure as shown in FIG. 8, without being limited to a planar gate structure. Reversely, the IGBT 21 shown in FIG. 8 may be an IGBT having a planar gate structure, without being limited to a trench gate structure.

FIG. 10 is a schematic cross-sectional view of a bipolar transistor 61 according to an embodiment of the present invention.

The bipolar transistor 61 includes a semiconductor layer 62. The semiconductor layer 62 includes an $n^+$ type collector region 63 and an $n^-$ type region 64 as an example of the first conductivity type semiconductor region according to the present invention, and a p-type base region as an example of the second conductivity type semiconductor region according to the present invention. The semiconductor layer 62 may be structured by epitaxially growing the $n^-$ type region 64 on the $n^+$ type collector region 63 as a base substrate. In that case, the p-type base region 65 may be an impurity diffusion layer selectively formed in the surface part of the $n^-$ type region 64.

A $p^+$ type base contact region 66 and an $n^+$ type emitter region 67 are formed spaced apart from each other in the surface part of the p-type base region 65.

A field insulating film 69 is formed on the front surface 68 of the semiconductor layer 62. The field insulating film 69 has contact holes 70, 71 for selectively exposing the $p^+$ type base contact region 66 and the $n^+$ type emitter region 67. The contact holes 70, 71 may have a taper-like lateral surface with the diameter narrowed down from the opening end toward the front surface 68 of the semiconductor layer 62.

A base electrode 72 and an emitter electrode 73 as examples of the surface electrode according to the present invention are formed on the front surface 68 of the semiconductor layer 62. The base electrode 72 is connected to the $p^+$ type base contact region 66 in the contact hole 70 of the field insulating film 69, and the emitter electrode 73 is connected to the n+ type emitter region 67 in the contact hole 71 of the field insulating film 69.

A collector electrode 75 as an example of the surface electrode according to the present invention is formed on the rear surface 74 of the semiconductor layer 62. The collector electrode 75 is connected to the n+ type collector region 63 on the rear surface 74 of the semiconductor layer 62.

In this bipolar transistor 61, the structure of the anode electrode 11 as shown in FIG. 3 is applicable to the base electrode 72, the emitter electrode 73, and the collector electrode 75. That is, the base electrode 72, the emitter electrode 73, and the collector electrode 75 may each include the first Al-based electrode 101, the Al-based oxide film 102, the second Al-based electrode 103, and the plated layer 104 laminated in order from the front surface 68 or the rear surface 74 of the semiconductor layer 62.

Figure 11:
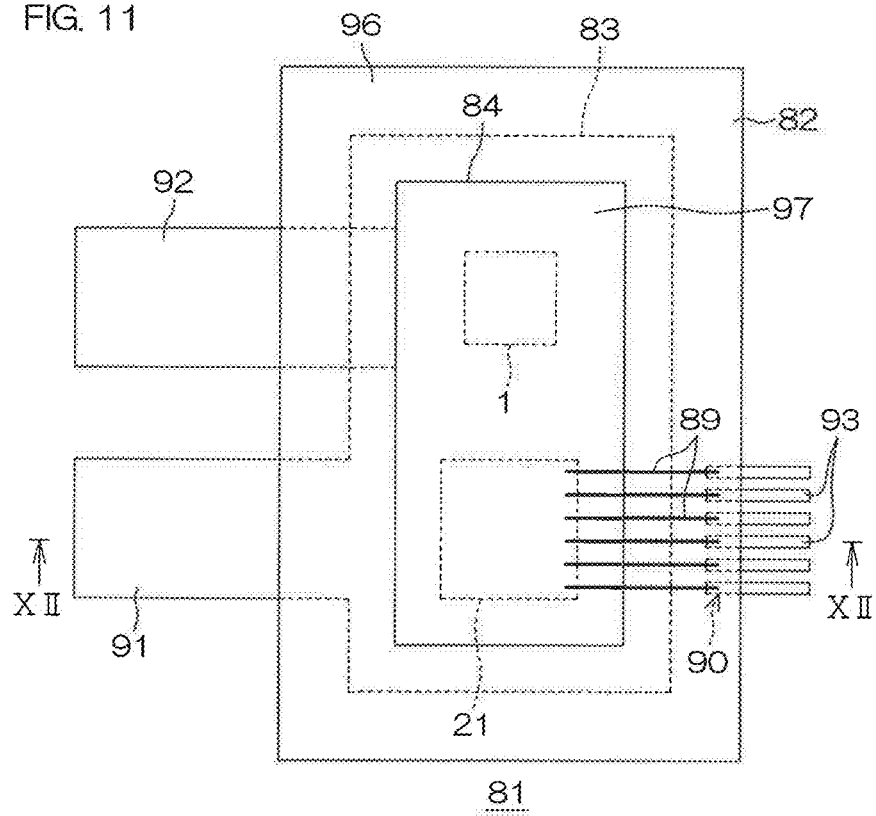
FIG. 11 is a schematic plan view of a semiconductor package including the IGBT and the pn diode.
Figure 12:
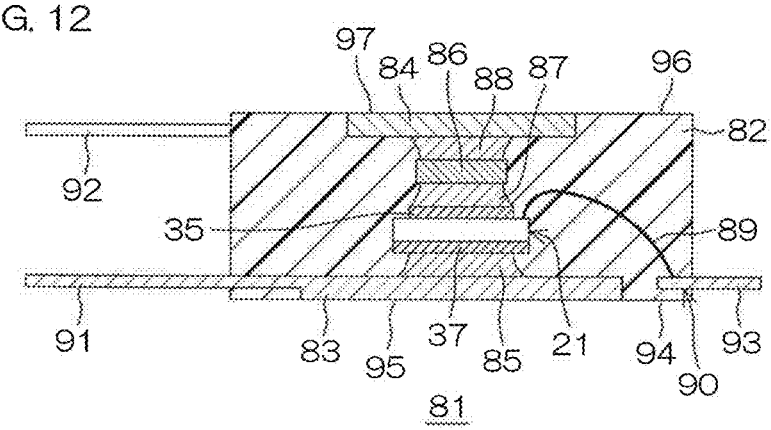
FIG. 12 is a cross-sectional view taken along the line XII-XII shown in FIG. 11.

Next, the structure of a package including the above-describe pn diode 1, IGBT 21, MISFET 41, and the bipolar transistor 61 is described with reference to FIGS. 11 and 12. Referring to FIGS. 11 and 12, the structure of the semiconductor package 81 including the IGBT 21 and the pn diode 1 (FRD) as examples of the package is described.

The package 81 is a package that dissipates heat from both surfaces, capable of releasing heat from both top and bottom surfaces of a resin package 82.

The semiconductor package 81 includes a lower heat spreader 83, an upper heat spreader 84, and the IGBT 21 and the pn diode 1 sandwiched between the lower heat spreader 83 and the upper heat spreader 84.

The IGBT 21 and the pn diode 1 are each provided on the lower heat spreader 83 with the cathode electrode 14 (not shown) and the collector electrode 37 joined to the lower heat spreader 83 with solder 85. A conductive spacer 86 made of, for example, Cu is provided between the upper heat spreader 84 and the emitter electrode 35 of the IGBT 21 and the anode electrode 11 (not shown) of the pn diode 1. The emitter electrode 35 and the anode electrode 11 are connected to the conductive spacer 86 with solder 87, and the conductive spacer 86 is connected to the upper heat spreader 84 with solder 88. Further, the IGBT 21 is connected to a plurality of leads 90 via a bonding wire 89.

The resin package 82 covers the lower heat spreader 83, the upper heat spreader 84, and the plurality of leads 90 so as to expose part thereof as terminals 91, 92, and 93. Further, one surface of the lower heat spreader 83 is exposed from a bottom surface 94 of the resin package 82 as a heat dissipation surface 95. Also, one surface of the upper heat spreader 84 is exposed from a top surface 96 of the resin package 82 as a heat dissipation surface 97.

Although embodiments according to the present invention are described, the present invention can also be put into practice by other embodiments.

For example, a structure, in which the conductivity type of the pn diode 1, the IGBT 21, the MISFET 41, and the bipolar transistor 61 is reversed, may be adopted. For example, in the pn diode 1, p-type may be reversed to n-type, and n-type may be revered to p-type.

The semiconductor device according to the present invention may be incorporated into a power module used in an inverter circuit that composes a drive circuit for driving an electric motor used as a power source for electric cars (hybrid cars included), trains, industrial robots and so forth. Further, the semiconductor device may also be incorporated into a power module used in an inverter circuit that converts electric power generated by solar batteries, wind power generators, and other power generating devices (particularly private electric generator) so as to be consistent with electric power from commercial power supply.

It is to be understood that variations and modifications can be made within the scope of matters described in claims.

What is claimed is:

1. A semiconductor device comprising:
   a semiconductor layer;
   a first metal layer in direct contact with the semiconductor layer; a second metal layer; a metal oxide film interposed between the first metal layer and the second metal layer, and a plated layer on the second metal layer; and
   an insulating layer in direct contact with the semiconductor layer, wherein
   the first metal layer has an extending portion extending along an upper surface of the insulating layer and in direct contact with the upper surface, and the extending portion of the first metal layer has an end portion on the upper surface of the insulating layer.

2. The semiconductor device according to claim 1, wherein the second metal layer has fine irregularities in at least a boundary portion with the plated layer.

3. The semiconductor device according to claim 1, wherein the second metal layer is thinner than the first metal layer.

4. The semiconductor device according to claim 1, wherein the first metal layer has a thickness of 3.0 μm to 5.0 μm, and the second metal layer has a thickness of 1.0 μm to 2.0 μm.

5. The semiconductor device according to claim 1, wherein the metal oxide film has a thickness of 10 Å to 40 Å.

6. The semiconductor device according to claim 1, wherein the plated layer has a thickness of 2.0 μm to 5.0 μm.

7. The semiconductor device according to claim 1, wherein the first metal layer is made of at least one material selected from a group of Al, AlSi, AlCu, and AlSiCu.

8. The semiconductor device according to claim 1, wherein the second metal layer is made of at least one material selected from a group of Al, AlSi, AlCu, and AlSiCu.

9. The semiconductor device according to claim 1, wherein the metal oxide film is made of aluminum oxide.

10. The semiconductor device according to claim 1, wherein the plated layer has an Ni layer on at least a portion in contact with the second metal layer.

11. The semiconductor device according to claim 1, wherein the semiconductor layer is made of Si or SiC.

12. The semiconductor device according to claim 1, wherein the semiconductor device includes a pn diode.

13. The semiconductor device according to claim 1, wherein the semiconductor device includes an IGBT.

14. The semiconductor device according to claim 1, wherein the semiconductor device includes a MISFET.

15. The semiconductor device according to claim 1, wherein the semiconductor device includes a bipolar transistor.

16. The semiconductor device according to claim 1, wherein the metal oxide film has an extending portion extending along the upper surface of the insulating layer, and the extending portion of the metal oxide film has an end portion above the upper surface of the insulating layer.

17. The semiconductor device according to claim 1, wherein the second metal layer has an extending portion extending along the upper surface of the insulating layer, and the extending portion of the second metal layer has an end portion above the upper surface of the insulating layer.

18. The semiconductor device according to claim 1, wherein the first metal layer has a contact portion which is in direct contact with the semiconductor layer, and a surface of the extending portion of the first metal layer facing the metal oxide film is positioned at a higher position than a surface of the contact portion of the first metal layer facing the metal oxide film.

* * * * *